United States Patent US 11,342,362 B2
Ishida et al. (45) Date of Patent: May 24, 2022

(54) DISPLAY DEVICE

(71) Applicant: SHARP KABUSHIKI KAISHA, Sakai (JP)

(72) Inventors: Izumi Ishida, Sakai (JP); Hirohiko Nishiki, Sakai (JP); Yujiro Takeda, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 17/042,866

(22) PCT Filed: Mar. 30, 2018

(86) PCT No.: PCT/JP2018/013942
§ 371 (c)(1),
(2) Date: Sep. 28, 2020

(87) PCT Pub. No.: WO2019/187139
PCT Pub. Date: Oct. 3, 2019

(65) Prior Publication Data
US 2021/0020662 A1 Jan. 21, 2021

(51) Int. Cl.
H01L 27/12 (2006.01)
G09G 3/3258 (2016.01)
H01L 27/32 (2006.01)

(52) U.S. Cl.
CPC ......... H01L 27/124 (2013.01); G09G 3/3258 (2013.01); H01L 27/1225 (2013.01);
(Continued)

(58) Field of Classification Search
CPC .......... H01L 29/78648; H01L 29/7869; H01L 27/124; H01L 27/1225; H01L 29/4908;
(Continued)

(56) References Cited

U.S. PATENT DOCUMENTS

2002/0093474 A1* 7/2002 Toyoshima .......... G09G 3/3648
345/87
2010/0127253 A1 5/2010 Inoue et al.
(Continued)

FOREIGN PATENT DOCUMENTS

JP 2003-086803 A 3/2003
JP 2010-232652 A 10/2010
(Continued)

Primary Examiner — Shaheda A Abdin
(74) Attorney, Agent, or Firm — ScienBiziP, P.C.

(57) ABSTRACT

A display device includes an active matrix substrate, wherein the active matrix substrate is layered with a base insulating film, a first metal layer, a metal oxide layer, a first inorganic insulating film, an oxide semiconductor layer, a second inorganic insulating film, a second metal layer, an interlayer insulating layer, and a third metal layer in order from a lower layer, and the active matrix substrate includes a first transistor configured of a first bottom gate electrode, a top gate electrode, and a source electrode and a drain electrode formed by the third metal layer, the source electrode and the drain electrode are respectively electrically connected to a source region and a drain region of the oxide semiconductor layer, the first bottom gate electrode is overlapped with the oxide semiconductor layer, and a metal of the first metal layer is different from a metal of the metal oxide layer.

13 Claims, 8 Drawing Sheets

(52) U.S. Cl.
CPC .. *G09G 2300/0809* (2013.01); *H01L 27/1288* (2013.01); *H01L 27/3262* (2013.01)

(58) Field of Classification Search
CPC ............ H01L 27/3262; H01L 27/1288; G09G 3/3258; G09G 2300/0809; G09G 2380/02; G09G 2300/0469
See application file for complete search history.

(56) References Cited

U.S. PATENT DOCUMENTS

| | | |
|---|---|---|
| 2010/0224880 A1 | 9/2010 | Kimura |
| 2011/0024755 A1 | 2/2011 | Korenari et al. |
| 2012/0153289 A1* | 6/2012 | Kaneko ............. H01L 29/78633 257/E33.012 |
| 2015/0279872 A1* | 10/2015 | Kato ................... H01L 27/1255 257/43 |
| 2016/0104723 A1* | 4/2016 | Tanaka ............... H01L 29/78633 257/43 |
| 2016/0155759 A1 | 6/2016 | Yamazaki et al. |

FOREIGN PATENT DOCUMENTS

| | | |
|---|---|---|
| JP | 2011-049529 A | 3/2011 |
| JP | 2014-175342 A | 9/2014 |
| JP | 2016-178279 A | 10/2016 |
| WO | 2007/040194 A1 | 4/2007 |

\* cited by examiner

DISPLAY DEVICE

TECHNICAL FIELD

The disclosure relates to a display device.

BACKGROUND ART

PTL 1 describes a thin film semiconductor element in which an anodic oxide film is formed between a bottom gate electrode and a bottom gate insulating film.

CITATION LIST

Patent Literature

PTL 1: JP 2003-86803 A (published on Mar. 20, 2003)

SUMMARY

Technical Problem

In manufacturing of a thin film transistor with a double gate structure including a bottom gate electrode and a top gate electrode, there is a problem that a threshold voltage varies in a negative direction in a case in which the top gate electrode is formed at a location where the bottom gate electrode is formed.

Solution to Problem

To solve the aforementioned problem, a display device according to an aspect of the disclosure is a display device including an active matrix substrate, in which the active matrix substrate is layered with a base insulating film, a first metal layer, a metal oxide layer, a first inorganic insulating film, an oxide semiconductor layer, a second inorganic insulating film, a second metal layer, an interlayer insulating layer, and a third metal layer in order from a lower layer, and the active matrix substrate includes a first transistor configured of a first bottom gate electrode formed by the first metal layer and overlapped with the oxide semiconductor layer with the first inorganic insulating film interposed between the first bottom gate electrode and the oxide semiconductor layer, a top gate electrode formed by the second metal layer and overlapped with the oxide semiconductor layer with the second inorganic insulating film interposed between the top gate electrode and the oxide semiconductor layer, and a source electrode and a drain electrode formed by the third metal layer, the source electrode and the drain electrode are respectively electrically connected to a source region and a drain region of the oxide semiconductor layer by interposing a contact hole formed in the interlayer insulating layer, the first bottom gate electrode is overlapped with the oxide semiconductor layer with the metal oxide layer interposed between the first bottom gate electrode and the oxide semiconductor layer, and a metal of the first metal layer is different from a metal of the metal oxide layer.

Advantageous Effects of Disclosure

According to an aspect of the disclosure, it is possible to suppress variations of a threshold voltage in a negative direction since the first gate electrode is overlapped with the oxide semiconductor layer with the metal oxide layer interposed between the first gate electrode and the oxide semiconductor layer.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Note that in the present embodiment, an organic EL display device provided with an active matrix-type organic EL panel, in which a substrate (active matrix substrate) with a thin film transistor (TFT) formed thereon as an active element is used as a substrate for mounting EL elements, and a plurality of light-emitting elements including organic EL elements provided as the EL elements on the substrate by interposing an interlayer insulating layer are included as pixel circuits (subpixel circuit portions), will be described as an example of a display device 2 according to the present embodiment.

General Display Device

First, a method of manufacturing a general display device including only a top gate electrode as a gate electrode and a configuration of a display region will be described.

Figure 1:
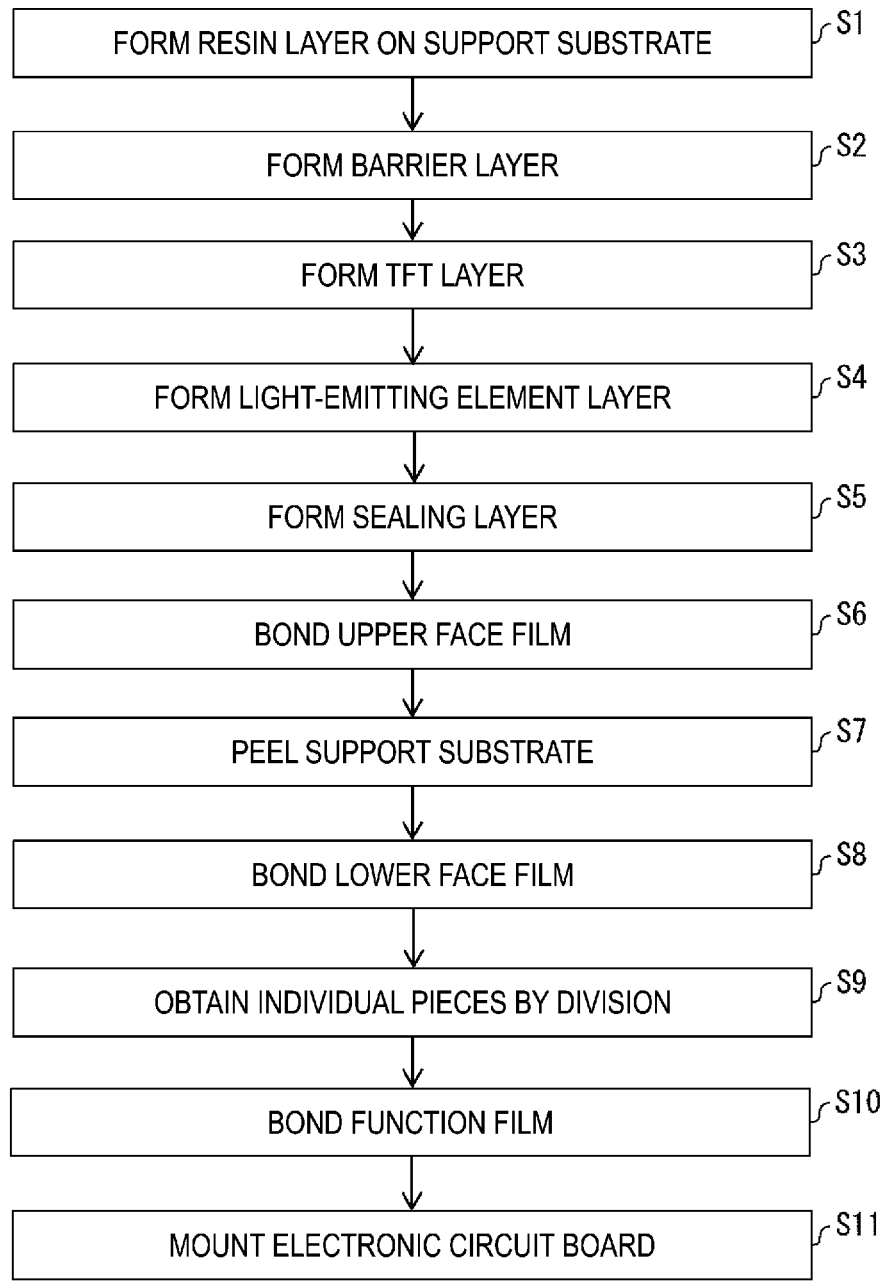
FIG. 1 is a flowchart illustrating an example of a method of manufacturing a display device.
Figure 2:
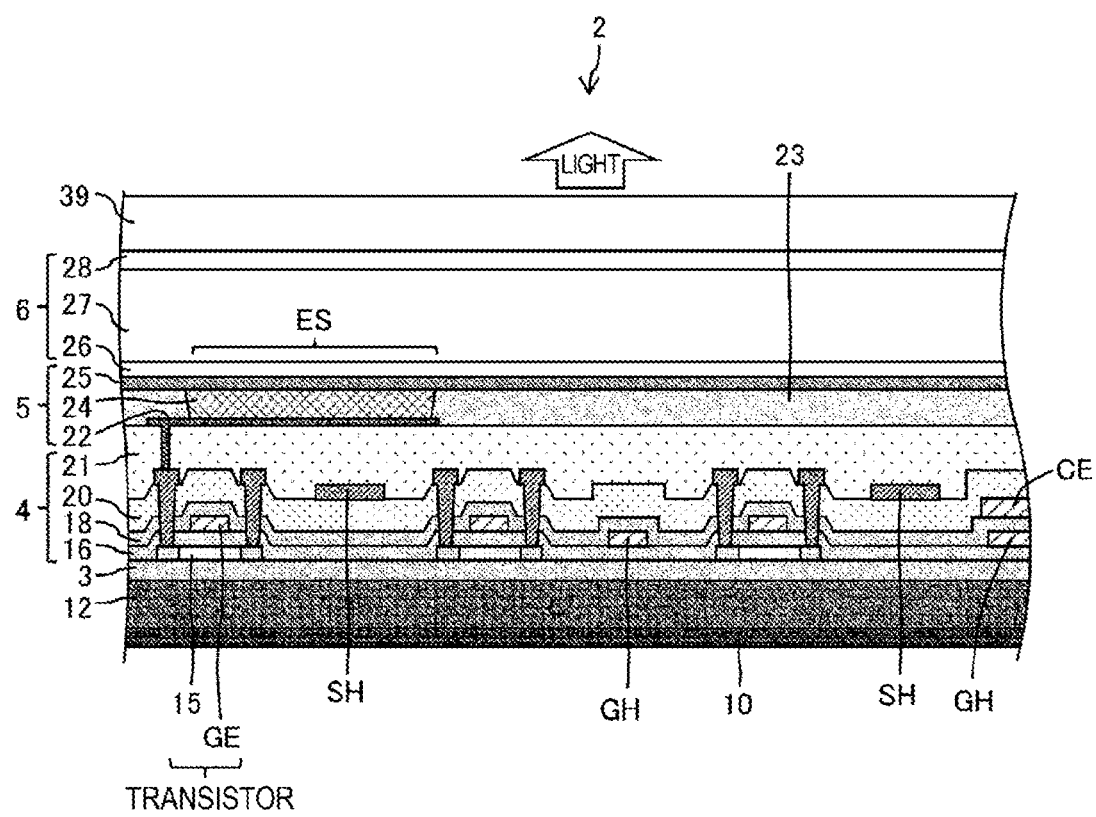
FIG. 2 is a cross-sectional view illustrating a configuration example of a display portion of the display device.

FIG. 1 is a flowchart illustrating an example of a method of manufacturing a general display device. FIG. 2 is a cross-sectional view illustrating a configuration of a display region of the general display device.

In a case in which a flexible display device 2 is manufactured, a resin layer (base insulating film) 12 is formed on a light-transmitting support substrate (for example, mother glass) first as illustrated in FIG. 1 and FIG. 2 (Step S1). Next, a barrier layer 3 is formed (Step S2). A TFT layer 4 is then formed (Step S3). A top-emitting-type light-emitting element layer 5 is then formed (Step S4). A sealing layer 6 is then formed (Step S5). An upper face film is then bonded on to the sealing layer 6 (Step S6).

Next, the support substrate is peeled off from the resin layer 12 through irradiation with laser light or the like (Step S7). A lower face film 10 is then bonded on to the lower face of the resin layer 12 (Step S8). A layered body including the lower face film 10, the resin layer 12, the barrier layer 3, the TFT layer 4, the light-emitting element layer 5, and the sealing layer 6 is then divided and a plurality of individual pieces are obtained (Step S9). A function film 39 is then bonded on the obtained individual pieces (Step S10). An electronic circuit board (examples of which include an IC chip and an FPC) is then mounted on a part (terminal portion) outside (non-display region, a frame) of a display region in which a plurality of subpixels are formed (Step S11). Note that Steps S1 to S11 are performed by a display device manufacturing apparatus (such as a film formation apparatus that performs each process in Steps S1 to S5).

Examples of a material of the resin layer 12 include a polyimide. The portion of the resin layer 12 can be replaced with two resin film layers (for example, polyimide films) and an inorganic insulating film interposed between the two resin film layers.

The barrier layer 3 is a layer that prevents foreign matters such as water and oxygen from reaching the TFT layer 4 and the light-emitting element layer 5, and can be constituted by, for example, a silicon oxide film, a silicon nitride film, or a silicon oxynitride film, or by a layered film thereof, formed by chemical vapor deposition (CVD).

The TFT layer 4 includes a semiconductor film 15, an inorganic insulating film 16 (gate insulating film) that is an upper layer than the semiconductor film 15, a gate electrode GE and a gate wiring line GH that are upper layers than the inorganic insulating film 16, an inorganic insulating film 18 that is an upper layer than the gate electrode GE and the gate wiring line GH, a capacitance electrode CE that is an upper layer than the inorganic insulating film 18, an inorganic insulating film 20 that is an upper layer than the capacitance electrode CE, a source wiring line SH that is an upper layer than the inorganic insulating film 20, and a flattening film 21 (interlayer insulating film) that is an upper layer than the source wiring line SH.

The semiconductor film 15 is configured of a low-temperature polysilicon (LTPS) or an oxide semiconductor (for example, an In—Ga—Zn—O based semiconductor), for example, and a transistor (TFT) is configured to include the semiconductor film 15 and the gate electrode GE.

The gate electrode GE, the gate wiring line GH, the capacitance electrode CE, and the source wiring line SH are configured of a single-layer film or a layered film of a metal including at least one of aluminum, tungsten, molybdenum, tantalum, chromium, titanium, and copper, for example. One semiconductor layer and three metal layers are included in the TFT layer 4 in FIG. 2.

Each of the inorganic insulating films 16, 18, and 20 can be configured of, for example, a silicon oxide (SiOx) film or a silicon nitride (SiNx) film, or a layered film of these, formed using CVD. The flattening film 21 can be configured, for example, of an organic material with which coating is possible, such as polyimide or acrylic.

The light-emitting element layer 5 includes an anode 22 that is an upper layer than the flattening film 21, an edge cover 23 having insulating properties that covers an edge of the anode 22, an electroluminescence (EL) layer 24 that is an upper layer than the edge cover 23, and a cathode 25 that is an upper layer than the EL layer 24. The edge cover 23 is formed by applying an organic material such as polyimide or acrylic, for example, and then performing patterning thereon by photolithography.

For each of the subpixels, a light-emitting element ES (for example, an organic light-emitting diode (OLED) or a quantum dot light emitting diode (QLED)) including the anode 22, the EL layer 24, and the cathode 25 with island shapes is formed on the light-emitting element layer 5, and a subpixel circuit adapted to control the light-emitting element ES is formed on the TFT layer 4.

For example, the EL layers 24 are configured by layering a hole injection layer, a hole transport layer, a light-emitting layer, an electron transport layer, and an electron injection layer in this order, from the lower layer side. The light-emitting layer is formed into an island shape at an opening (for each subpixel) of the edge cover 23 by a deposition method or an inkjet method. Other layers are formed in an island shape or a solid-like shape (common layer). A configuration is also possible in which one or more layers are not formed, out of the hole injection layer, the hole transport layer, the electron transport layer, and the electron injection layer.

In a case in which an OLED light-emitting layer is formed through deposition, a fine metal mask (FMM) is used. The FMM is a sheet including multiple openings (made of an invar material, for example), and an island-shaped light-emitting layer (corresponding to one subpixel) is formed by an organic material passing through one opening.

For a light-emitting layer of the QLED, it is possible to form an island-shaped light-emitting layer (corresponding to one subpixel) by inkjet-applying a solvent in which quantum dots are diffused, for example.

An anode (anode electrode) 22 is configured through layering of indium tin oxide (ITO) and Ag (silver) or an alloy containing Ag, for example, and has light reflective properties.

A cathode 25 can be configured of a light-transmitting conductive material such as a MgAg alloy (ultrathin film), ITO, or indium zinc oxide (IZO).

In a case in which the light-emitting element ES is an OLED, positive holes and electrons are recombined in the light-emitting layer due to a drive current between the anode 22 and the cathode 25, and light is emitted in a process in which excitons caused by the recombination transition to a ground state. Since the cathode 25 is light-transmitting and the anode 22 has light reflective properties, the light emitted from the EL layer 24 travels upward and becomes top-emitting.

In a case in which the light-emitting element ES is a QLED, positive holes and electrons are recombined in the light-emitting layer due to a drive current between the anode 22 and the cathode 25, and light (fluorescence) is emitted in a process in which excitons caused by the recombination transition from a conduction band to a valence band of a quantum dot.

A light-emitting element other than the aforementioned OLED and QLED (such as an inorganic light-emitting diode) may be formed in the light-emitting element layer 5.

The sealing layer 6 is light-transmitting and includes an inorganic sealing film 26 that covers the cathode 25, an organic buffer film 27 that is an upper layer than the inorganic sealing film 26, and an inorganic sealing film 28 that is an upper layer than the organic buffer film 27. The sealing layer 6 covering the light-emitting element layer 5 inhibits foreign matter, such as water and oxygen, from penetrating into the light-emitting element layer 5.

Each of the inorganic sealing film 26 and the inorganic sealing film 28 is an inorganic insulating film and can be configured, for example, of a silicon oxide film, a silicon nitride film, or a silicon oxynitride film, or a layered film thereof formed by the CVD method. The organic buffer film 27 is a light-transmitting organic film with a flattening effect and can be configured of an organic material with which coating is possible, such as acrylic. Although the organic buffer film 27 can be formed through inkjet application, for example, a bank for stopping liquid droplets may be provided in the non-display region.

The lower face film 10 is, for example, a PET film for realizing a display device with excellent flexibility by being bonded to a lower face of the resin layer 12 after the support substrate is peeled off. The function film 39 has at least one of an optical compensation function, a touch sensor function, and a protection function, for example.

Although the flexible display device 2 has been described above, in a case in which a non-flexible display device is manufactured, because formation of the resin layer, replacement of the base material, and the like are typically not needed, the processing moves on to Step S9 after the layering process in Steps S2 to S5 is performed on the glass substrate, for example.

First Embodiment

Figure 3:
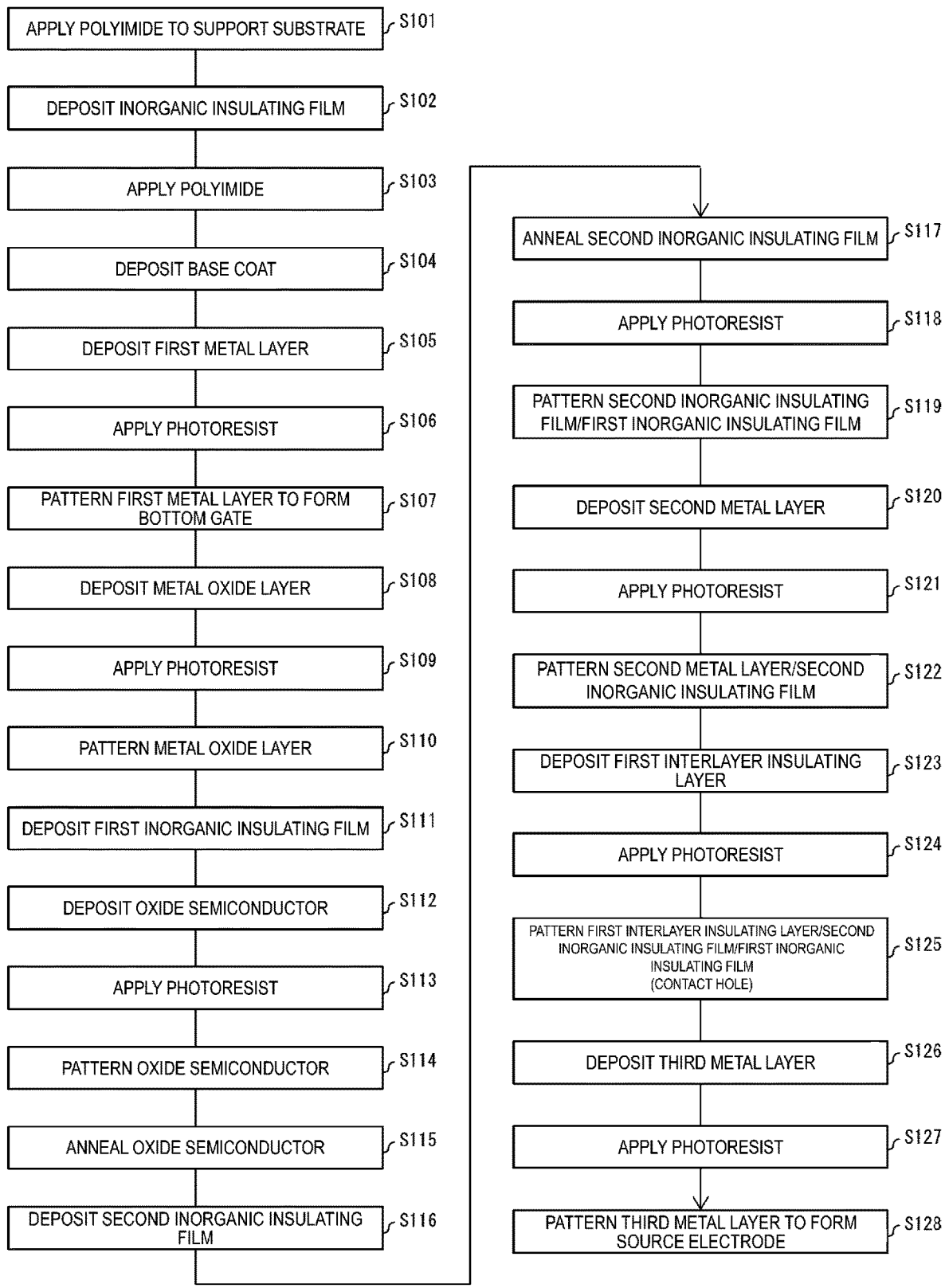
FIG. 3 is a flowchart illustrating an example of the method of manufacturing the display device, in particular, a flow for forming a TFT layer.
Figure 4:
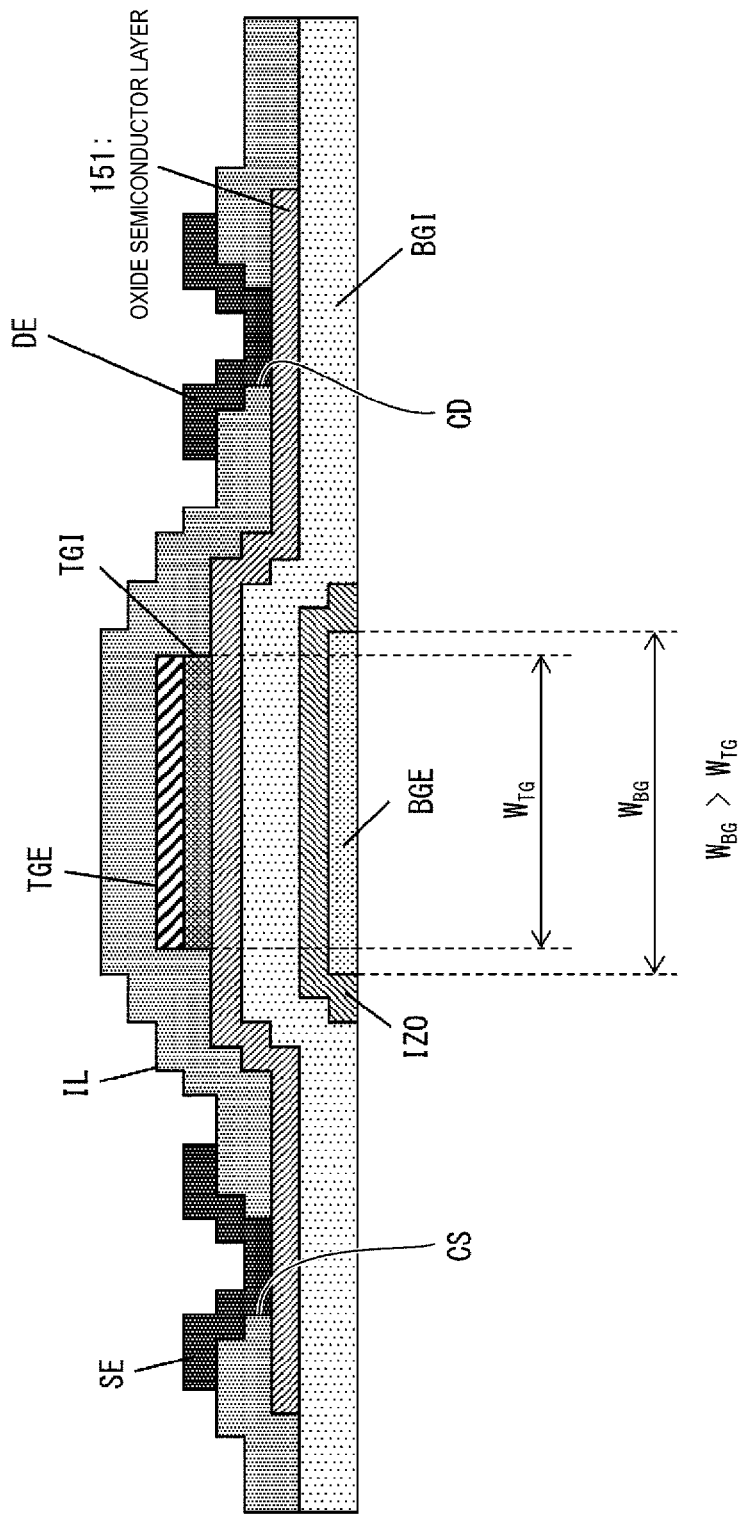
FIG. 4 is a cross-sectional view illustrating a configuration example of the display portion of the display device, which is a configuration example of the TFT layer in a cross-section cut along the line A-A' illustrated in FIG. 7 except that no contact hole CBT is provided.

FIG. 3 is a flowchart illustrating a method of manufacturing a display device according to the present embodiment, and is a flowchart illustrating a detailed flow for forming the TFT layer (Step S3) illustrated in FIG. 1. FIG. 4 is a cross-sectional view illustrating a display portion of the display device, in particular, details of the TFT layer in the cross-section cut along the line A-A' illustrated in FIG. 7 except that no contact hole CBT is provided. For the display device according to the present embodiment, at least one of the thin film transistors (TFTs) in the general display device as described above is produced with a double gate structure including a top gate electrode and a bottom gate electrode.

In a case in which a thin film transistor with a double gate structure is formed, a resin layer is formed on a light-transmitting support substrate (mother glass, for example) first, as illustrated in FIGS. 3 and 4. Specifically, polyimide, for example, is applied to the support substrate (Step S101). Next, an inorganic insulating film is deposited (Step S102). Polyimide is then applied again (Step S103). In other words, the resin layer is formed of two resin film (polyimide film) layers and an inorganic insulating film interposed between the two resin film layers.

Next, a barrier layer is formed. A TFT layer is then formed. Specifically, a base coat is deposited first (Step S104).

Next, a first metal layer is deposited (Step S105). A photoresist is then applied (Step S106). The first metal layer is then patterned using a photolithography technique to form a bottom gate electrode BGE (first bottom gate electrode) in the first metal layer (Step S107).

Next, a metal oxide layer (for example, IZO) is deposited (Step S108). A photoresist is then applied (Step S109). A metal oxide layer is then patterned using a photolithography technique (Step S110).

Next, a first inorganic insulating film (for example, $SiO_2$) is deposited (Step S111). An oxide semiconductor layer is then deposited (Step S112). A photoresist is then applied (Step S113). An oxide semiconductor layer is then patterned using a photolithography technique (Step S114). An oxide semiconductor is then annealed (Step S115).

Next, a second inorganic insulating film is deposited (Step S116). The second inorganic insulating film is then annealed (Step S117). A photoresist is then applied (Step S118). The second inorganic insulating film and the first inorganic insulating film are then patterned using a photolithography technique (Step S119). In this manner, a contact hole CBT connecting the top gate electrode TGE and the bottom gate electrode BGE is formed.

Next, a second metal layer is deposited (Step S120). A photoresist is then applied (Step S121). The second metal layer and the second inorganic insulating film are then patterned using a photolithography technique to form the top gate electrode TGE (Step S122). The top gate electrode TGE and the second inorganic insulating film (top gate insulating film TGI) have matched wiring line patterns. Note that the application of the photoresist and the patterning for the second metal layer and the second inorganic insulating film may be performed separately.

Next, an interlayer insulating layer is deposited (Step S123). A photoresist is then applied (Step S124). The interlayer insulating layer, the second inorganic insulating film, and the first inorganic insulating film are then patterned using a photolithography technique to form a contact hole (Step S125).

Next, a third metal layer is deposited (Step S126). A photoresist is then applied (Step S127). The third metal layer is then patterned using a photolithography technique to form a source electrode SE (Step S128).

As described above, the TFT layer 4 includes the base coat, the first metal layer (bottom gate electrode BGE) that is an upper layer than the base coat, the metal oxide layer (indium zinc oxide (IZO) or indium tin oxide (ITO)) that is an upper layer than the first metal layer, the first inorganic insulating film (bottom gate insulating film BGI) that is an upper layer than the metal oxide layer, the oxide semiconductor that is an upper layer than the first inorganic insulating film, the second inorganic insulating film (top gate insulating film TGI) that is an upper layer than the oxide semiconductor, the second metal layer (top gate electrode TGE) that is an upper layer than the second inorganic insulating film, the interlayer insulating layer IL that is an upper layer than the top gate electrode, and the third metal layer (source electrode SE) that is an upper layer than the interlayer insulating layer. Also, the source electrode SE and the drain electrode DE are electrically connected to a source region and a drain region of the oxide semiconductor layer by interposing the contact hole formed in the interlayer insulating layer IL. The bottom gate electrode BGE is overlapped with the oxide semiconductor layer with the metal oxide layer interposed between the bottom gate electrode BGE and the oxide semiconductor layer. A metal of the first metal layer is different from a metal of the metal oxide layer (IZO or ITO).

The gate electrode GE is configured of a single-layer film or a layered film of a metal including at least one of aluminum (Al), tungsten (W), molybdenum (Mo), tantalum (Ta), chromium (Cr), titanium (Ti), and copper (Cu). For example, the top gate electrode TGE may be configured of a layered film of Ti/Al/Ti, and the bottom gate electrode BGE may be configured of a layered film of W/TaN or may be formed of tungsten (W), molybdenum (Mo), or titanium (Ti).

Each of the first inorganic insulating film and the second inorganic insulating film can be configured of a silicon oxide (SiOx) film, a silicon nitride (SiNx) film, or a layered film thereof formed by the CVD method, for example.

Also, the bottom gate electrode BGE may be configured to have a wider width in a channel direction than the top gate electrode TGE. In other words, a configuration in which a width $W_{BG}$ of the bottom gate electrode in the channel direction is greater than a width $W_{TG}$ of the top gate electrode in the channel direction ($W_{BG} > W_{TG}$) may be employed.

As described above, the metal oxide layer is overlapped with the upper layer of the bottom gate electrode BGE in the present embodiment. In this manner, it is possible to suppress variations of the threshold voltage on a negative side in a case in which the transistor with the double gate structure including the bottom gate electrode and the top gate electrode is formed. The threshold voltage shifts to the negative side because hydrogen is released due to tungsten (W) in the bottom gate electrode BGE and the oxide semiconductor layer is transformed into a conductor. Note that similar effects are achieved when molybdenum is used instead of tungsten for the bottom gate electrode BGE.

The double gate structure provides an electric field from the upper and lower sides of the oxide semiconductor layer. In the present embodiment, it is possible to cause the threshold voltage to vary on the positive side due to oxygen desorbed from the metal oxide layer and to suppress transformation of the oxide semiconductor into a conductor.

Note that the metal oxide layer is not limited to IZO as described above and may be a metal oxide layer of ITO or the like and this also leads to similar effects to those achieved in a case in which IZO is used.

Also, similar effects are achieved if an insulating film that facilitates desorption of oxygen is used for the first inorganic insulating film.

Figure 5:
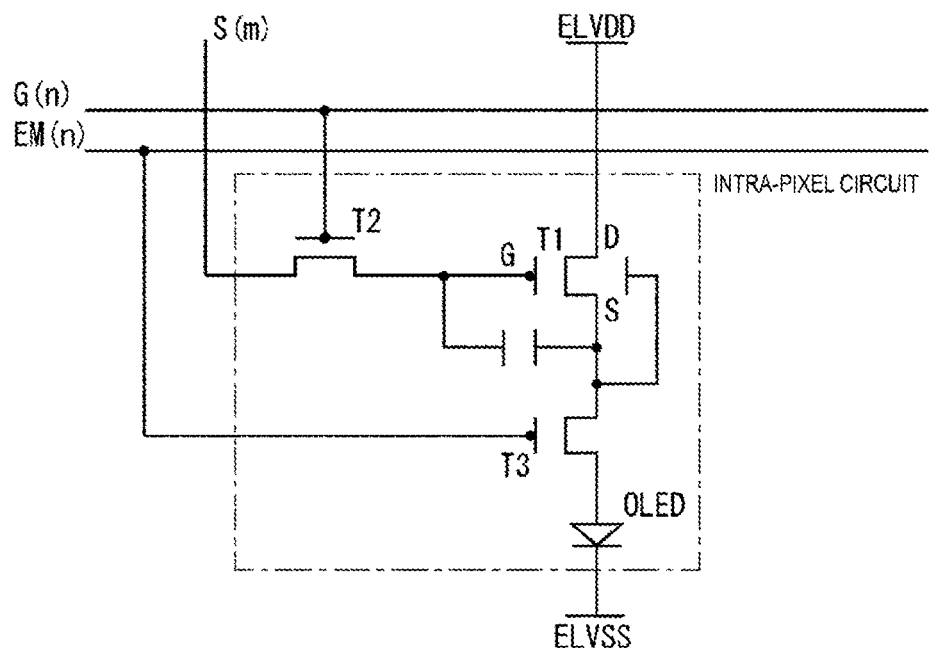
FIG. 5 is a circuit diagram illustrating a configuration example of a subpixel in a display region.
Figure 6:
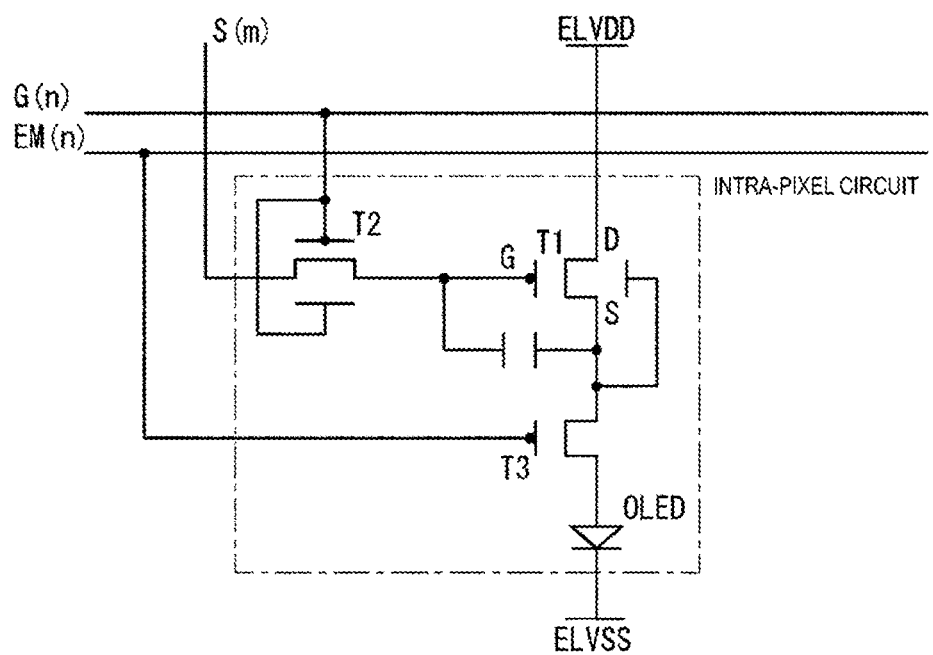
FIG. 6 is a circuit diagram illustrating a configuration example of the subpixel in a display region.

FIG. 5 and FIG. 6 are circuit diagrams (intra-pixel circuit) illustrating a configuration example of a subpixel in the display region. FIG. 5 illustrates an example in which a drive transistor T1 (first transistor) is configured to have a double gate structure including two gate electrodes, namely a top gate electrode and a bottom gate electrode (first bottom gate electrode), and a write transistor T2 (second transistor) and a light emission control transistor T3 (third transistor) are configured only of top gate electrodes. In other words, the transistor including only the top gate electrode TGE and the transistor including the top gate electrode TGE and the bottom gate electrode BGE are present together on the same substrate. Also, FIG. 6 illustrates an example in which each of the drive transistor T1 and the write transistor T2 is configured to have a double gate structure including two gate electrodes, namely the top gate electrode and the bottom gate electrode, and the light emission control transistor T3 is configured only of the top gate electrode. This is a configuration in which the bottom gate electrode BGE of the drive transistor T1 is covered with the metal oxide layer while the bottom gate electrode (second bottom gate electrode) of the write transistor T2 (second transistor) is not covered with the metal oxide layer.

An intra-pixel circuit of a subpixel is formed in the TFT layer illustrated in FIG. 4. In the TFT layer, a scanning signal line G(n) and a light-emitting signal line EM(n) extending in a row direction are provided, and an initialization power supply line S(m) is provided. The intra-pixel circuit includes the intra-pixel circuit including the drive transistor T1, the write transistor T2, the light emission control transistor T3, and the capacitance and the light-emitting element ES (for example, an organic light-emitting diode (OLED)) formed in the light-emitting element layer 5 in FIG. 2. Note that the light emission control transistor T3 is not essential. The top gate electrode TGE and the source electrode SE of the drive transistor T1 are connected to each other by interposing a capacitor, and the bottom gate electrode BGE and the source electrode SE of the drive transistor T1 are electrically connected to each other. However, the top gate electrode TGE of the drive transistor T1 and the drain electrode DE may be connected to each other by interposing a capacitor, which means, in short, that a data signal voltage is input to the top gate electrode TGE of the drive transistor T1.

Note that the threshold voltage of the drive transistor T1 may be higher than the threshold voltage of the write transistor T2. Because luminance of an organic light-emitting diode (OLED) is defined by a data signal sent to a control terminal of the drive transistor T1, the luminance is more easily adjusted when the threshold voltage is higher. On the other hand, since the write transistor T2 functions as a switching transistor, the threshold voltage may be low.

It is possible to selectively use transistors depending on desired functions of the transistors by forming the transistors with different threshold voltages on the same substrate in this manner. For example, a voltage for adjusting the threshold value is input to the bottom gate electrode BGE of the drive transistor T1. This enables adjustment of the threshold voltage in addition to the effect of the metal oxide layer (IZO). The threshold voltage varies on the negative side when a positive voltage is input to the bottom gate electrode BGE, and the threshold voltage varies on the positive side when a negative voltage is input. Examples of the positive voltage include a high-power supply voltage (about 5 V), and examples of the negative voltage include a low-power supply voltage (about −5 V).

For example, when the source electrode SE and the control terminal are connected to each other by interposing a capacitor, and the source electrode SE and the bottom gate electrode BGE are electrically connected, the threshold voltage varies on the positive side. If the write transistor T2 is a transistor provided only with the top gate electrode TGE, the threshold voltage (example: 4 V) of the drive transistor T1 is higher to the positive side than the threshold voltage (example: about 1 V) of the write transistor T2.

The write transistor T2 is connected to the scanning signal line G(n) and the drive transistor T1. The drive transistor T1 becomes active during a period when the scanning signal line Gn becomes active, and the light-emitting element ES (OLED) emits light with luminance in accordance with a supplied voltage during a period when the light-emitting signal line EM(n) becomes active.

In a case in which the write transistor T2 has a double gate structure as illustrated in FIG. 6, the top gate electrode and the bottom gate electrode are connected to each other. The bottom gate electrode of the drive transistor T1 has a voltage that conforms to the voltage on the negative side of the drive transistor T1.

Figure 10:
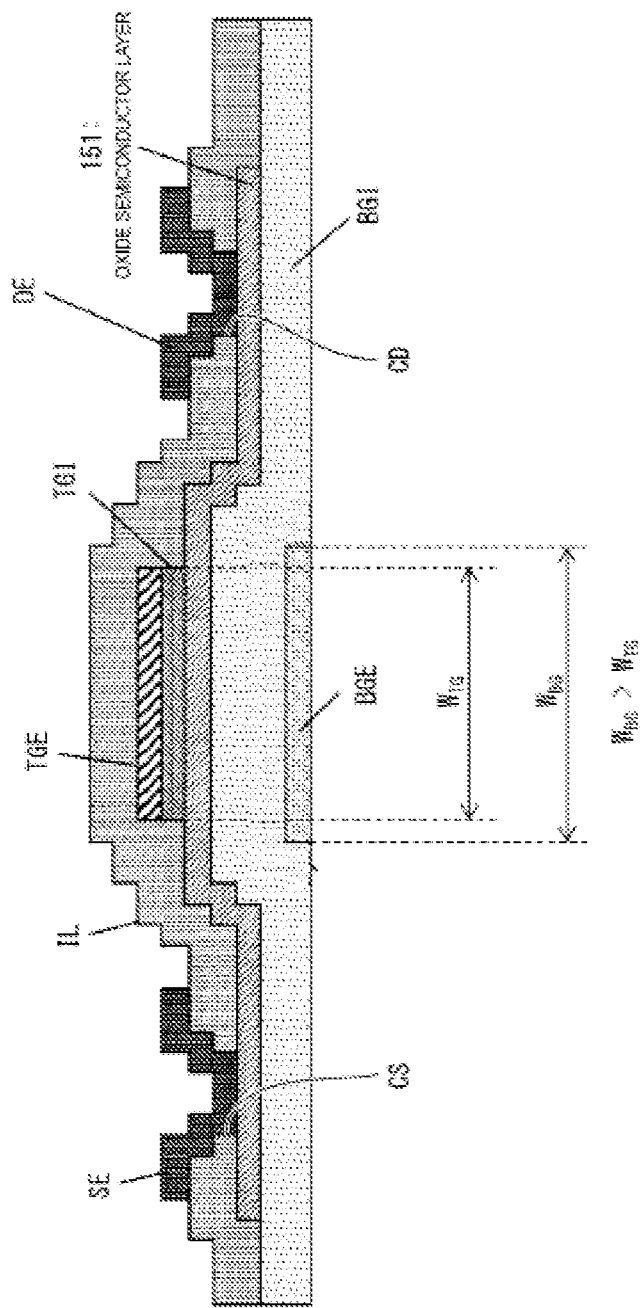
FIG. 10 is a cross-sectional view of the TFT layer in a cross-section cut along the line A-A' illustrated in FIG. 7 with a contact hole CBT.

Note that the write transistor T2 may have a configuration in which the bottom gate electrode BGE is not covered with the metal oxide layer even in a case of the double gate structure. FIG. 10 is a cross-sectional view of the TFT layer in the cross-section cut along the line A-A' illustrated in FIG. 7 with a contact hole CBT.

Figure 7:
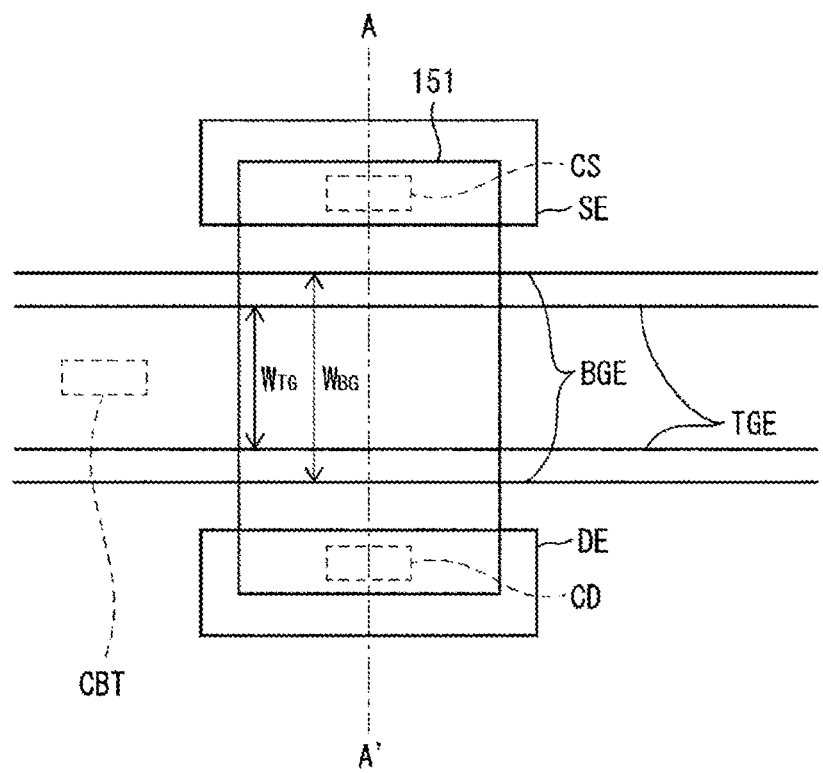
FIG. 7 is a top view illustrating a configuration example of the subpixel in the display region.

FIG. 7 is a top view of a transistor with a double gate structure (for example, the write transistor T2 in FIG. 6). However, although FIG. 7 is a top view of the write transistor T2, and the contact hole CBT is formed, a top view of the drive transistor T1 is the same as FIG. 7 except that no contact hole CBT is provided. It is possible to ascertain that when the transistor with the double gate structure is seen from the top as illustrated in FIG. 7, a contact hole CS connecting the source electrode SE to the oxide semiconductor is present at a location where the source electrode SE and the oxide semiconductor are overlapped with each other, a contact hole CD connecting the drain electrode DE to the oxide semiconductor is present at a location where the drain electrode DE and the oxide semiconductor are overlapped with each other, and a contact hole CBT connecting the top gate electrode to the bottom gate electrode is present at a location where the top gate electrode TGE and the bottom gate electrode BGE are overlapped with each other.

Figure 8:
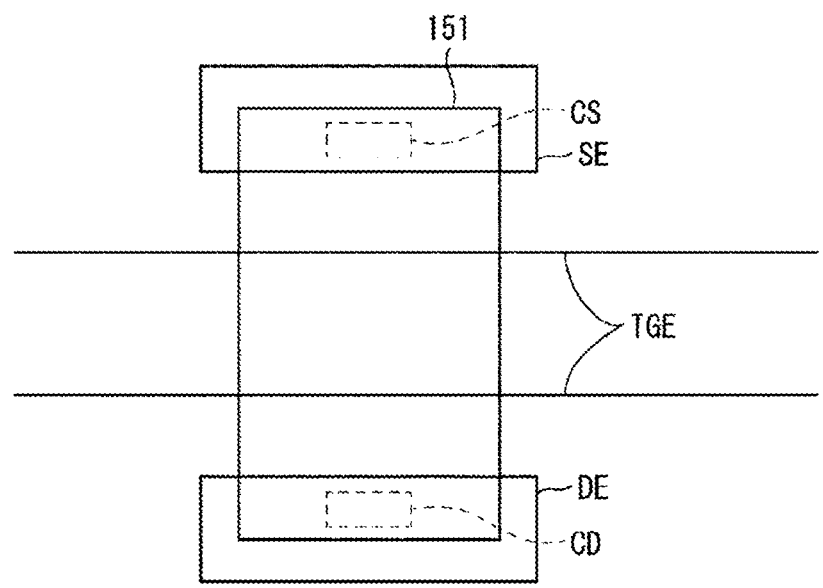
FIG. 8 is a top view illustrating a configuration example of the subpixel in the display region.

FIG. 8 is a top view of a transistor (for example, the write transistor T2 in FIG. 5) provided only with the top gate electrode. It is possible to ascertain that when the transistor provided only with the top gate electrode is seen from the top as illustrated in FIG. 8, the contact hole CS connecting the source electrode SE to the oxide semiconductor is present at a location where the source electrode SE and the oxide semiconductor are overlapped with each other, and the contact hole CD connecting the drain electrode DE to the oxide semiconductor is present at a location where the drain electrode DE and the oxide semiconductor are overlapped with each other.

Figure 9:
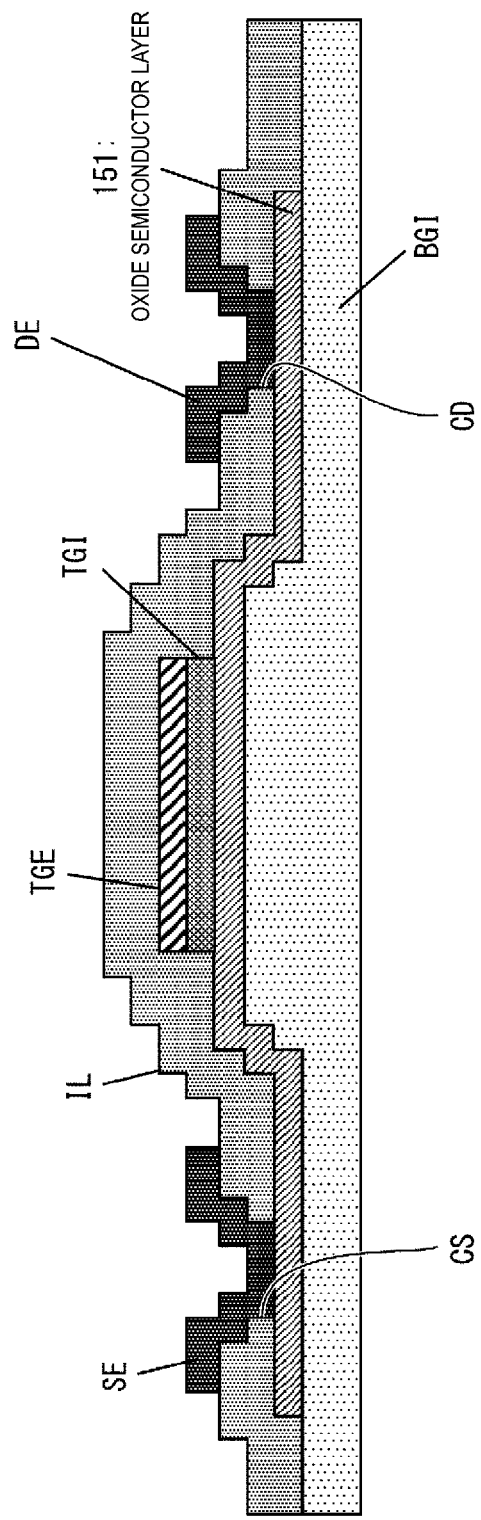
FIG. 9 is a cross-sectional view illustrating a configuration example of the display portion of the display device, which is a configuration example of the TFT layer in a case in which only a top gate electrode is included.

FIG. 9 is a cross-sectional view of the TFT layer in a case in which the transistor is configured only of the top gate electrode. In a case in which only the top gate electrode is provided as illustrated in FIG. 9, layers corresponding to the bottom gate electrode BGE and the metal oxide layer (IZO) illustrated in FIG. 4 are not present.

Second Embodiment

In the present embodiment, the bottom gate electrode and the metal oxide layer have matched wiring line patterns. This can be achieved by performing the application of the photoresist in Step S106 and Step S109 in FIG. 3 described above and the patterning in Steps S107 and S110 in a common fashion. This processing can be performed as long as a configuration in which the bottom gate electrodes of all the transistors on the substrate are covered with the metal oxide layer is employed.

The example of the intra-pixel circuit in the present embodiment is similar to that in FIG. 5 described above, a transistor (write transistor T2) provided with only a top gate electrode TGE and a transistor (drive transistor T1) including a top gate electrode TGE and a bottom gate electrode BGE are provided on the same substrate, and the bottom gate electrode BGE of the drive transistor T1 is covered with the metal oxide film.

Regarding Oxide Semiconductor

An oxide semiconductor included in the oxide semiconductor layer may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer can be formed of an oxide semiconductor film including an In—Ga—Zn—O-based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A as described above, JP 2012-134475 A, and JP 2014-209727 A. The entire contents of the disclosure of JP 2012-134475 A and JP 2014-209727 A are incorporated herein as reference. A TFT including an In—Ga—Zn—O based semiconductor layer has high mobility (more than 20 times as compared to an a-Si TFT) and a low leakage current (less than 1/100th as compared to the a-Si TFT), and thus such a TFT can be used suitably as a driving TFT (for example, a TFT present in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_xZn_{1-x}O$), cadmium zinc oxide ($Cd_xZn_{1-x}O$), or the like. As the Zn—O based semiconductor, ZnO, to which one or a plurality of impurity elements from among Group I elements, Group XIII elements, Group XIV elements, Group XV elements, Group XVII elements or the like have been added, in an amorphous state, a polycrystalline state, or a microcrystalline state in which ZnO in the amorphous state and ZnO in the polycrystalline state are present together, or ZnO to which no impurity elements have been added can be used.

Supplement

An electro-optical element (an electro-optical element whose luminance and transmittance are controlled by an electric current) that is provided in a display device according to the present embodiment is not particularly limited thereto. Examples of the display device according to the present embodiment include an organic electro luminescence (EL) display provided with an organic light-emitting diode (OLED) as an electro-optical element, an inorganic EL display provided with an inorganic light-emitting diode as an electro-optical element, and a quantum dot light-emitting diode (QLED) display provided with a QLED as an electro-optical element.

First Aspect

A display device includes an active matrix substrate. The active matrix substrate is layered with a base insulating film, a first metal layer, a metal oxide layer, a first inorganic insulating film, an oxide semiconductor layer, a second inorganic insulating film, a second metal layer, an interlayer insulating layer, and a third metal layer in order from a lower layer, and the active matrix substrate includes a first transistor configured of a first bottom gate electrode formed by the first metal layer and overlapped with the oxide semiconductor layer with the first inorganic insulating film interposed between the first bottom gate electrode and the oxide semiconductor layer, a top gate electrode formed by the second metal layer and overlapped with the oxide semiconductor layer with the second inorganic insulating film interposed between the top gate electrode and the oxide semiconductor layer, and a source electrode and a drain electrode formed by the third metal layer. The source electrode and the drain electrode are respectively electrically connected to a source region and a drain region of the oxide semiconductor layer by interposing a contact hole formed in the interlayer insulating layer, the first bottom gate electrode is overlapped with the oxide semiconductor layer with the metal oxide layer interposed between the first bottom gate electrode and the oxide semiconductor layer, and a metal of the first metal layer is different from a metal of the metal oxide layer.

Second Aspect

The display device according to the first aspect, in which the metal oxide layer includes indium zinc oxide (IZO) or indium tin oxide (ITO).

Third Aspect

The display device according to the first or second aspect, in which the first bottom gate electrode is formed of tungsten, molybdenum, or titanium.

Fourth Aspect

The display device according to any one of the first to third aspects, in which the metal oxide layer and the first bottom gate electrode have matched wiring line patterns.

Fifth Aspect

The display device according to any one of the first to fourth aspects, in which the first bottom gate electrode has a wider width in a channel direction than the top gate electrode.

Sixth Aspect

The display device according to any one of the first to fifth aspects, in which the active matrix substrate includes a second transistor provided with a second bottom gate electrode, the second bottom gate electrode being overlapped with the oxide semiconductor layer with the first inorganic insulating film interposed between the second bottom gate electrode and the oxide semiconductor layer, and the second bottom gate electrode being not covered with the metal oxide layer.

Seventh Aspect

The display device according to the sixth aspect, in which the active matrix substrate includes a pixel circuit including a drive transistor and a write transistor, the first transistor is the drive transistor, and the second transistor is the write transistor.

Eighth Aspect

The display device according to the seventh aspect, in which a data signal voltage is input to the top gate electrode of the drive transistor, and the first bottom gate electrode and the source electrode are electrically connected to each other.

Ninth Aspect

The display device according to the seventh or eighth aspect, in which the second bottom gate electrode of the write transistor and the top gate electrode of the write transistor are electrically connected to each other.

Tenth Aspect

The display device according to any one of the seventh to ninth aspects, in which a threshold voltage of the drive transistor is higher than a threshold voltage of the write transistor.

Eleventh Aspect

The display device according to any one of the seventh to tenth aspects, in which the active matrix substrate includes a third transistor, the third transistor being adapted such that a gate electrode does not include the first bottom gate electrode and the second bottom gate electrode and includes only the top gate electrode.

Twelfth Aspect

The display device according to the eleventh aspect, in which the first transistor is the drive transistor, and the third transistor is the write transistor.

Thirteenth Aspect

The display device according to the twelfth aspect in which the top gate electrode and the source electrode of the drive transistor are connected to each other by interposing a capacitor, and the first bottom gate electrode and the source electrode are electrically connected to each other.

Fourteenth Aspect

The display device according to the twelfth or thirteenth aspect, in which a threshold voltage of the drive transistor is higher than a threshold voltage of the write transistor.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device comprising an active matrix substrate, wherein:
   the active matrix substrate is layered with a base insulating film, a first metal layer, a metal oxide layer, a first inorganic insulating film, an oxide semiconductor layer, a second inorganic insulating film, a second metal layer, an interlayer insulating layer, and a third metal layer in order from a lower layer,
   a metal of the first metal layer is different from a metal of the metal oxide layer,
   the active matrix substrate comprises a first transistor and a second transistor,
   the first transistor comprises:
      a first bottom gate electrode formed by the first metal layer and overlapped with the oxide semiconductor layer with the first inorganic insulating film interposed between the first bottom gate electrode and the oxide semiconductor layer,
      a top gate electrode formed by the second metal layer and overlapped with the oxide semiconductor layer with the second inorganic insulating film interposed between the top gate electrode and the oxide semiconductor layer, and
      a source electrode and a drain electrode formed by the third metal layer,
   the source electrode and the drain electrode are respectively electrically connected to a source region and a drain region of the oxide semiconductor layer by interposing a contact hole formed in the interlayer insulating layer,
   the first bottom gate electrode is overlapped with the oxide semiconductor layer with the metal oxide layer interposed between the first bottom gate electrode and the oxide semiconductor layer, and
   the second transistor comprises:
      a second bottom gate electrode overlapped with the oxide semiconductor layer with the first inorganic insulating film interposed between the second bottom gate electrode and the oxide semiconductor layer, and the second bottom gate electrode not being covered with the metal oxide layer.

2. The display device according to claim 1, wherein the metal oxide layer includes indium zinc oxide (IZO) or indium tin oxide (ITO).

3. The display device according to claim 1, wherein the first bottom gate electrode is formed of tungsten, molybdenum, or titanium.

4. The display device according to claim 1, wherein the metal oxide layer and the first bottom gate electrode have matched wiring line patterns.

5. The display device according to claim 1, wherein the first bottom gate electrode has a wider width in a channel direction than the top gate electrode.

6. The display device according to claim 1, wherein:
   the active matrix substrate further comprises a pixel circuit,
   the pixel circuit comprises a drive transistor and a write transistor,
   the first transistor is the drive transistor, and
   the second transistor is the write transistor.

7. The display device according to claim 6, wherein:
   a data signal voltage is input to the top gate electrode of the drive transistor, and
   the first bottom gate electrode and the source electrode are electrically connected to each other.

8. The display device according to claim 6, wherein the second bottom gate electrode of the write transistor and the top gate electrode of the write transistor are electrically connected to each other.

9. The display device according to claim 6, wherein a threshold voltage of the drive transistor is higher than a threshold voltage of the write transistor.

10. The display device according to claim 6, wherein:
    the active matrix substrate further comprises a third transistor, and
    the third transistor is adapted such that a gate electrode does not include the first bottom gate electrode and the second bottom gate electrode and includes only the top gate electrode.

11. The display device according to claim 10, wherein:
    the first transistor is the drive transistor, and
    the third transistor is the write transistor.

12. The display device according to claim 11, wherein:
    the top gate electrode and the source electrode of the drive transistor are connected to each other by interposing a capacitor, and
    the first bottom gate electrode and the source electrode are electrically connected to each other.

13. The display device according to claim 11, wherein a threshold voltage of the drive transistor is higher than a threshold voltage of the write transistor.

* * * * *